United States Patent [19]
Seeds et al.

[11] 3,936,858
[45] Feb. 3, 1976

[54] MOS TRANSISTOR STRUCTURE

[75] Inventors: Robert B. Seeds; Robert L. Luce, both of Los Altos Hills, Calif.

[73] Assignee: Fairchild Camera and Instrument Corporation, Mountain View, Calif.

[22] Filed: Aug. 19, 1974

[21] Appl. No.: 498,674

Related U.S. Application Data

[63] Continuation of Ser. No. 323,672, Jan. 15, 1973, abandoned.

[52] U.S. Cl. .................. 357/23; 357/52; 357/55
[51] Int. Cl.² .................. H01L 29/78; H01L 29/34; H01L 29/06
[58] Field of Search .................. 357/23, 49, 52, 55

[56] References Cited
OTHER PUBLICATIONS

Philips Research Reports — Vol. 26, No. 3 — June 1971 pp. 166–180.

*Primary Examiner*—Martin H. Edlow
*Assistant Examiner*—E. Wojciechowicz
*Attorney, Agent, or Firm*—Alan H. MacPherson; Henry K. Woodward; J. Ronald Richbourg

[57] ABSTRACT

An MOS transistor is constructed such that the insulation covering the field of the device and in direct contact with the top surface of the semiconductor material in which the source and drain regions are formed, tapers gradually in thickness to that of the insulation under the gate electrode thereby to prevent abrupt step-heights in the transition region between the field insulation and the gate insulation.

6 Claims, 9 Drawing Figures

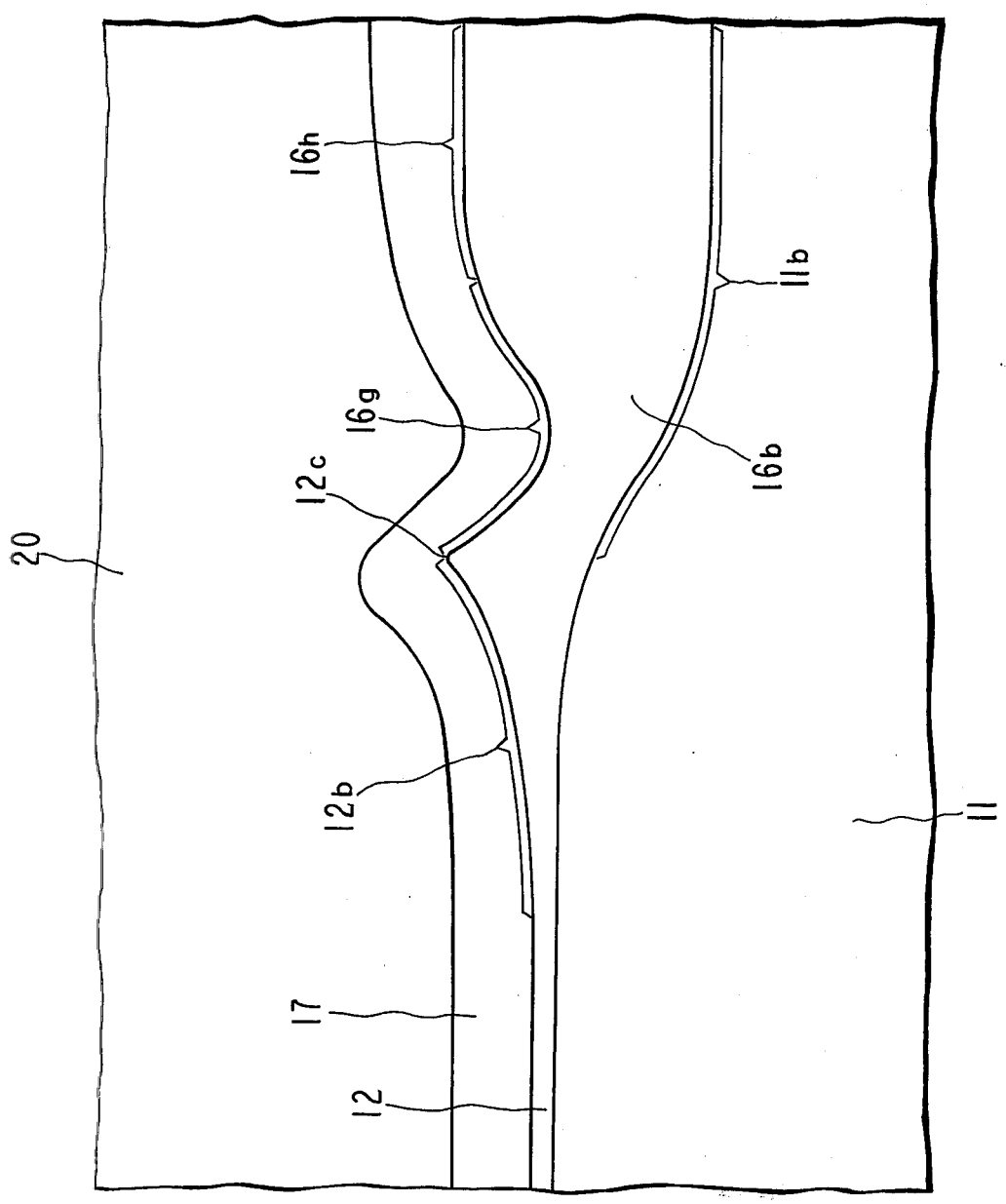

MOS TRANSISTOR STRUCTURE

This is a continuation of application Ser. No. 323,672 filed Jan. 15, 1973, now abandoned.

BACKGROUND OF THE INVENTION

1. Field of the Invention

This invention relates to MOS transistors and in particular to an MOS silicon transistor wherein the gate oxide is formed so as to achieve extremely stable and reproducible MOS transistors with perdictable characteristics.

2. Prior Art

Mos semiconductor transistors are well known. Such transistors are extremely sensitive to small amounts of contamination at the interface between insulation layers and the underlying semiconductor material containing the source and drain regions. As the size of MOS transistors has decreased, proper alignment of masks and particularly the source and drain masks, has become more important. The use of a self-aligned gate of polycrystalline silicon as disclosed in Klein et al U.S. Pat. No. 3,673,471 issued June 27, 1972 makes possible the reduction in size of the source and drain regions, reduces the overlap of the gate with respect to the source and drain regions and thus makes possible higher speed performance of MOS transistors.

In an MOS transistor, a thin insulating layer is placed between the semiconductor substrate containing the source and drain regions and the gate electrode. To prevent unwanted inversions of the semiconductor material in the field (i.e., the non-active portion) of the device when a voltage is applied to the gate electrode, a much thicker insulating layer is placed over the field of the device than under the gate electrode. As disclosed in the above-mentioned Klein et al patent, typically the field insulation is an order of magnitude thicker than the gate insulation. To make an MOS transistor by the prior art methods, the field oxide is first formed on the wafer. Those portions of the field oxide over the regions of the semiconductor substrate in which sources and drains are to be formed are then removed. After formation of the source and drain regions, the field oxide over the gate region is removed and the gate oxide if formed. The gate oxide is typically of a thickness on the order of 1,000 angstroms.

The removal of the field oxide over the active regions of the semiconductor substrate allows these regions of the substrate to become contaminated and makes difficult the further processing of the device to grow a uniform thickness gate oxide. Typically, contaminants gather on the edges of the field oxide and result in short circuit forming between a subsequently formed gate electrode and the source and/or drain regions. In addition, the different thickness of the field and gate oxides cause an abrupt step in the insulation adjacent the source and drain regions. Such a step greatly increases the risk of open circuits in the conductive leads contacting the source and drain regions.

SUMMARY OF THE INVENTION

This invention overcomes the problems arising from the processing sequence of the prior art wherein the gate oxide is formed after the field oxide.

According to this invention, in the formation of an MOS transistor at least part of the gate oxide is first formed on semiconductor material. Subsequently, a field oxide is selectively grown over the surface of the semiconductor material except in those regions where the active MOS transistors will be formed. The field oxide is formed in such a manner that the field oxides tapers into the gate oxide thereby allowing the gradual transition of conductive leads from the field oxide to the gate oxide and to the source and/or drain regions of the MOS transistor.

Formation of the gate oxide as the first of several high temperature operations minimizes the bulk impurity "pile-up" of depletion which is characteristic of oxidation processes in prior art methods.

By retaining the gate oxide on the device throughout the processing, the surface of the device is protected and contaminants and other impurities are prevented from forming on the surface of the semiconductor material. As a result, the process of this invention yields on the average more MOS transistors per wafer than heretofore obtained.

DESCRIPTION OF THE DRAWINGS

FIG. 2 shows in cross-section the tapered transition between field oxide 16 and gate oxide 12.

DETAILED DESCRIPTION

This invention will be described using silicon semiconductor material. However, it should be understood that this invention can be used with any other semiconductor material suitable for use in forming MOS transistors and capable of having an oxide of the semiconductor material thermally grown from the semiconductor material.

A silicon substrate 11 (FIG. 1a) has formed on it a gate oxide 12. Typically gate oxide 12 is formed by thermal oxidation of substrate 11 and is approximately 1,000 angstroms thick. It should be understood, however, that any thickness gate oxide suitable for yielding an MOS transistor with desired characterstics can be used with the process of this invention. Silicon substrate 11 typically is of four to six ohm-cm resistivity and typically is cut in the 111 orientation although other orientations such as the 100 orientation can also be used. While oxide layer 12 is preferably formed by thermal oxidation of silicon substrate 11, this oxide layer could also be formed by other techniques capable of forming a satisfactory gate insulation.

Hereafter substrate 11 and any attached overlying layers will be called wafer 10.

Figure 1A:
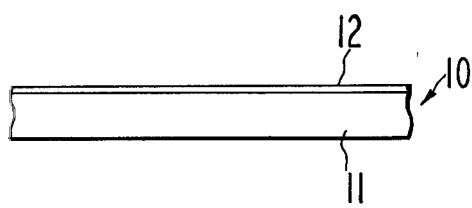
FIGS. 1a through 1h illustrates the process of this invention.
Figure 1B:
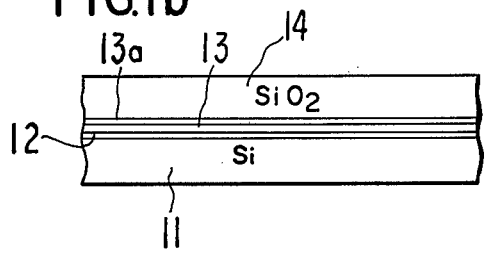

A layer 13 of silicon nitride is formed over oxide layer 12 (FIG. 1b). Nitride layer 13 typically is 1,000 angstroms thick although again, other thicknesses of nitride can be used, as required.

A thin layer 13a of oxide (FIG. 1b) is next formed from the top surface of nitride layer 13. Techniques for the oxidation of a nitride layer are well known and are described, for example, in a paper by Appels et al entitled "Local Oxidation of Silicon and Its Application in Semiconductor-Device Technology" published in Philips Research Reports 25, 118–132, 1970. Typically, layer 13a is 50 angstroms or so thick. It should be noted that this step is optional and can be omitted if desired.

Next layer 14 of silicon dioxide is formed over the thin oxidized nitride layer. In one embodiment silicon dioxide layer 14 is about 6,000 angstroms thick and is formed from the decomposition of silane in an oxygen environment. Silicon dioxide layer 14 adheres well to the oxidized nitride layer 13a; in fact layer 13a was formed to provide an adherent base for layer 14.

The next step in the process is not illustrated in the drawings but comprises a bulk gettering at typically 1,070°C in a phosphorus oxychloride environment. The resulting phosphorus-rich glass comprising the top portion of layer 14 is removed from the semiconductor device. In one embodiment 3,000 angstroms of layer 14 are removed.

Figure 1C:
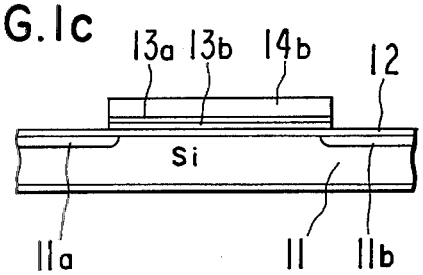

As shown in FIG. 1c, dioxide layer 14 and underlying nitride layer 13 are removed from all portions of the field of the semiconductor device. To do this, oxide layer 14 is first masked to leave exposed all oxide in the field of the device. Layer 14 is then etched down to nitride layer 13 using a preferential etch which etches silicon dioxide at a much faster rate than silicon nitride. Then when all the exposed oxide 14 over nitride 13 has been removed, the newly-exposed silicon nitride 13 is removed by an etch which etches nitride at a much faster rate than it does silicon dioxide. Accordingly, when the silicon nitride 13 overlying the gate oxide 12 has been removed, the etch used to remove the silicon nitride does not attack gate oxide 12 to any great extent. The resulting etched structure is shown in FIG. 1c wherein portion 14b of silicon dioxide layer 14 remains overlying region 13b of silicon nitride layer 13 which in turn overlies the active region of the device.

At this point, the field region of the silicon device, that is, the region of the semiconductor device within which will not be formed source, drain and gate regions of MOS transistors, is implanted with a selected impurity by use of ion implantation techniques. Ion implantation allows the conductivity-type determining impurities to be passed through gate oxide 12 and placed in a region of the semiconductor substrate 11 directly beneath the gate oxide. Thus, regions 11a and 11b shown in FIG. 1c contain ion implanted impurities. When the semiconductor substrate is N-type, these impurities are formed to a concentration such that the implanted semiconductor material has N+type conductivity. When the silicon substrate is of P type conductivity, the impurities are formed such that the ion implanted regions have a P+type conductivity. Typical thickness for the ion implanted regions 11a and 11b is 1,000 angstroms and a typical impurity concentration in these regions is $10^{16}$ atoms per cc.

Next, wafer 10 is placed in an oxidizing environment at an elevated temperature. The oxygen in the environment combines with the silicon from silicon substrate 11 beneath those portions of the gate oxide 12 not covered by nitride 13b to form thick regions 16a and 16b (FIG. 1d) of oxidized semiconductor material. Regions 16a and 16b are typically about 1.6 microns thick. Oxidation of silicon semiconductor material results in a thickness increase of the material by a factor of about 2.2. Accordingly, regions 16a and 16b consume approximately 0.7 micron of underlying semiconductor material 11 to form silicon dioxide layers 1.6 microns thick. During the high temperature thermal oxidation process, regions 11a and 11b of N+type conductivity migrate further into silicon semiconductor substrate 11. This migration occurs both because of the different diffusivities and segregation coefficients of the conductivity-determining impurities in regions 11a and 11b in silicon as opposed to silicon dioxide and the prolonged high temperature. Accordingly, the oxidized regions 16a and 16 b do not contain a significant amount of the impurity in regions 11a and 11b. If, however, substrate 11 contains boron as a predominant impurity and thus is P type, regions 16a and 16b may contain significant amounts of boron. Also, region 16e of silicon dioxide is formed on the backside of the wafer during the oxidation process. Region 16f (FIG. 1d) was formed earlier during formation of gate oxide 12 and oxide layer 14.

Figure 1D:
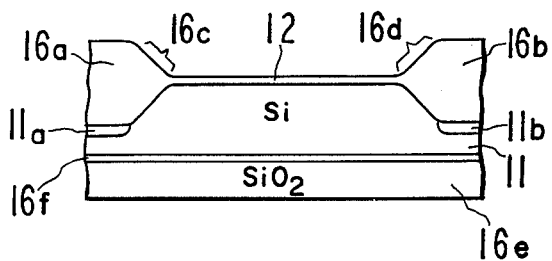

The formation of thick field oxide 16a and 16b is followed by the removal of nitride 13b and overlying silicon dioxide 14b (FIG. 1c). The resulting structure is shown in FIG. 1d. Note that in regions 16c and 16d of the field oxide, the oxide tapers gradually from the thickness of the field oxide 14 to the thickness of the gate oxide 12. This taper makes possible the subsequent contacting of source and drain regions by leads crossing the field oxide and then dropping gradually to the elevation of the gate oxide without the high probability of open circuits at steps in the oxide so prevalent in the prior art.

Following the formation of the structure shown in FIG. 1d, a layer 17 (FIG. 1e) of polycrystalline silicon is formed over the top surface of the device. Layer 17 is typically formed after opening 12b is formed in gate oxide 12. Thus part of layer 17 contacts the surface of substrate 11. Polycrystalline silicon layer 17 typically is approximately 3,000 to 3,300 angstroms thick. However, other thickness can be used for this layer if desired. Techniques for the deposition of polycrystalline silicon suitable for use with this invention are well known as thus will not be described in detail.

The top surface of polycrystalline silicon layer 17 is next oxidized to form silicon dioxide layer 18. Standard photoengraving techniques are used to mask the oxidized polycrystalline silicon layer 17 above the gate regions to be formed in or on substrate 11 and above the conductive interconnections to be formed from polycrystalline silicon. The oxide is removed in those areas not protected by photoresist. The exposed polycrystalline silicon is then removed.

The resulting structure (FIG. 1f) has polycrystalline silicon region 17a formed on its top surface over gate oxide 12 and protected by overlying oxide layer 18a. The polycrystalline silicon in regions 17b and 17c has been removed. Polycrystalline silicon 17d, containing on its top surface an oxide layer 18d, overlies not only part of the active region of the device, but also part of the field of the device. After being doped, this polycrystalline silicon will serve as conductive lead to the active region to be formed in substrate 11 beneath opening 12b in gate oxide 12. In addition, regions of doped polycrystalline silicon can be used as conductive crossunders beneath metal leads.

Next, the gate oxide 12 not covered by polycrystalline silicon in regions 17a, 17d and not part of field oxide regions 16a, 16b is removed to expose the top surfaces of the regions of semiconductor material 11 in which are to be formed the source and drain regions of an MOS transistor. Simultaneously with the selective removal of gate oxide 12, the oxidized portions 18a, 18d of polycrystalline silicon regions 17a, 17d are also removed.

An impurity, typically boron when substrate 11 is of N type conductivity, is next diffused into substrate 11 to form the source and drain regions 19a, 19b of an MOS transistor. While the gate oxide above the source and drain regions 19a, 19b has described as being completely removed during this process step, this gate oxides can be only partially removed, if desired. That portion of gate oxide 12 left on substrate 11 during the diffusion process must, however, be thin enough to allow the passage of the impurity through it to form the source and drain regions 19a, 19b beneath gate oxide 12.

During diffusion of boron into substrate 11 to form source and drain regions 19a, 19b, boron also diffuses into regions 17a and 17d of polycrystalline silicon 17 to form gate electrode 17a and conductive lead 17d.

If the diffusion is carried out in an oxidizing atmosphere, a thin oxide layer will reform over the source and drain regions. Part of this oxide layer can be removed to allow electrical contact to be made to drain region 19b. Note that region 19a has already been contacted through window 12b (FIG. 1e) by polycrystalline silicon 17d. Alternatively, a metal contact of a material such as aluminum can be to region 19a.

After the formation of the doped gate electrode 17a, the doped conductive lead 17d, and the source and drain regions 19a, 19b by diffusion of a P type impurity, a layer of passivating material 20 (FIG. 1g) is formed over the top surface of the device. Typically, layer 20 consists of a phosphorous-doped silicon dioxide layer formed to a thickness of about 6,000 angstroms. However, other insulating and/or passivating layers can also be formed over the top surface of the device, if desired. These layers, can, if desired, comprise multiple layers of material and can include layers of silicon nitride, for example.

Wafer 10 is now heated to allow glass 20 to flow and to continue the diffusion of the boron in regions 19a, 19b into substrate 11 to further expand the source and drain region 19a, 19b. This heat treatment is well known in the semiconductor arts and thus will not be described in detail.

Upon completion of the above-described heat treatment, contact openings are formed in layer 20 to expose the regions in substrate 11 to which electrical contact is to be made. While region 19a already is contacted by doped polycrystalline silicon lead 17d, electrical contact must be made to region 19b. Contact window 20a in layer 20 to expose the surface of region 19b is formed using well-known photolithographic and masking techniques. In addition, contact is also made to the doped polycrystalline silicon remaining on the device through other windows in layer 20.

At this point, oxide layers 16e and 16f on the backside of the wafer (see FIG. 1d) are removed by, for example, etching.

A layer 21 of conductive material is now formed over the top surface of layer 20. Typically this layer is formed of evaporated aluminum. Layer 21 contacts the top surfaces of regions in substrate 11 through windows such as window 20a through layer 20. Conductive layer 21, which in one embodiment comprised a 1.2 micron thick aluminum layer, is next masked and etched to define the conductive lead pattern on the top surface of the device. This masking and etching step is well known and thus will not be described here.

Wafer 10 is next alloyed to form good electrical contacts between portions of layer 21 and substrate 11.

The final step comprises forming a layer of phosphorus doped silicon dioxide over the wafer surface to an approximate thickness of 1.0 micron. This step is followed by masking the contact pads on the top surface of the device to be formed from layer 21 and etching away the silicon dioxide to expose these contact pads and the scribe regions between die.

The device formed by the above process has a buried contact 17d to region 19a. In addition, the surface of substrate 11 on which the transistors are formed has at all times been protected by gate oxide 12 thereby preventing impurities from reaching the interface between oxide 12 and substrate 11. While additional oxide 16a, 16b in the field of the device is formed during the process, this field oxide is an extension of the gate oxide. As an important feature of this invention, the interface between the gate oxide 12 and field oxide 16 is tapered thereby reducing the severity of the steps which must be traversed by conductive leads such as leads 17d and 21 which contact the source and drain regions of the underlying semiconductor device. In addition, the severity of the step traversed by the contact to gate 17a is likewise reduced by this tapered surface.

Figure 1E:
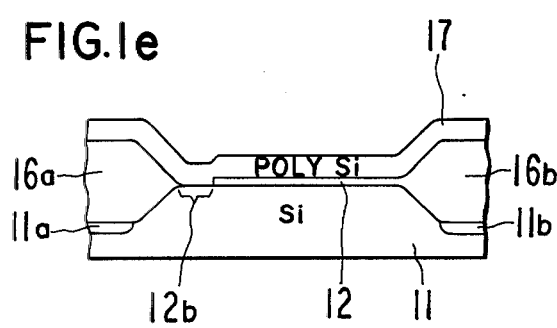
Figure 1F:
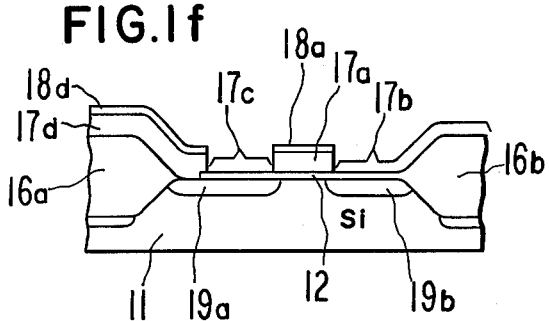
Figure 1G:
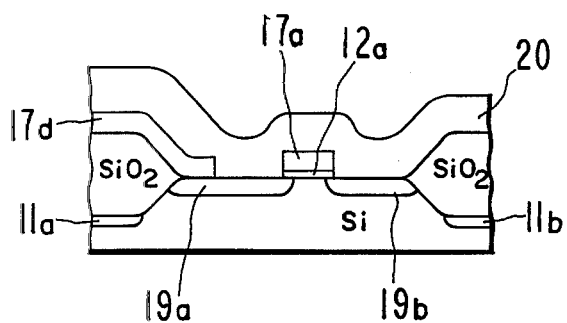
Figure 1H:
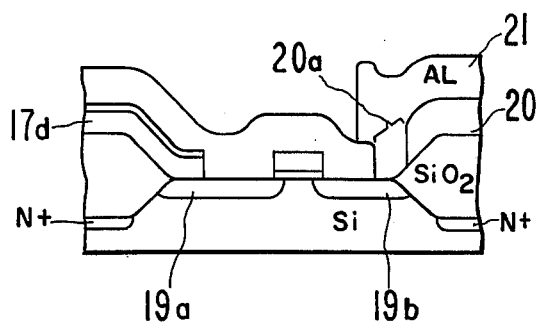

FIG. 2 shows in more detail the transition region between gate oxide 12 and field oxide 16b with polycrystalline silicon 17 overlying both oxides, as shown in FIG. 1e. The structure shown in FIG. 2 is based on an actual photograph of the transition region between gate oxide 12 and field oxide 16b. As shown in FIG. 2, field oxide 16b is gradual extension of gate oxide 12 increasing gradually in thickness over region 12b. At pack 12c, the gradual increase in thickness of the oxide abruptly terminates and the slope of the surface of oxide 16b reverses. A trough 16g forms on the surface of oxide 16b but then in region 16h the field oxide gradually acquires a flat surface and becomes uniform in thickness. Region 11b of highly doped N type material remains just under the lower surface of the field oxide 16b. Polycrystalline silicon 17 forms a substantially uniform layer over the top surface of gate oxide 12 and field oxide 16 despite the presence of peak 12c and trough 16g in the gate and field oxides 12 and 16b. A silicon dioxide layer 20 overlies polycrystalline layer 17.

A second embodiment of this invention varies several of the process steps. In this second embodiment, substrate 11 is oxidized to form gate oxide 12. Next a nitride layer 13 (FIG. 1b) is deposited over gate oxide 12 to a thickness of about 1,000 angstroms. Oxide (not shown in the figures) formed on the backside of wafer 11 is then removed, typically by an etch. This oxide was formed simultaneously with the gate oxide and is the same thickness as the gate oxide (typically about 1,000 angstroms). Next a layer 14 (FIG. 1b) of silicon dioxide is deposited over the top surface of nitride 13. Prior to the deposition of layer 14, nitride layer 13 can be oxidized, if desired, to provide an improved base on which layer 14 can be formed. Layer 14 is typically 5,000 angstroms.

The structure is now bulk gettered with a phosphorus trichloride compound at a high temperature, typically around 1,070°C for a selected time. After the gettering is completed, layer 14 is stripped from the device. Nitride layer 13 is now oxidized, typically in steam at 1,000°C, for a time selected to form an oxide to a thickness of about 50 angstroms. The 50 angstrom thick oxide overlying the nitride is then removed throughout the field of the device, leaving oxide over the source, drain and gate regions of the nitride. The nitride exposed by removal of the oxide throughout the field of the device is then removed with phosphoric acid etch at 155°C. Following this step, the exposed gate oxide (a thickness of about 1,050 angstroms) is removed. This allows observation of the unetched or partially etched areas of the field oxide resulting from incomplete nitride removal. Thus regions of nitride inadvertently left in the field of the device are readily discernible at this point in the process and can be readily removed.

Next, impurities are implanted in the field of the device using ion implantation techniques. Typically these impurities are implanted to a surface density of $2 \times 10^{12}$ atoms per square centimeter using a 40 KEV ion beam.

After the ions are implanted throughout the field of device, the field is reoxidized in 1,000°C steam to grow an oxide layer of about 1.3 microns. The oxide on the silicon nitride over the source, drain and gate regions to be formed in or on the underlying substrate 11 initially was 50 angstroms thick. After the oxidation, this oxide is about 250 angstroms thick. This 250 angstrom thick oxide on the nitride is stripped by etching. The etching continues longer than neccessary to remove the 250 angstroms of oxide over the nitride and typically an extra amount of oxide (for example up to 750 angstroms) is removed over the device to insure complete removal of all oxide on the nitride. Finally, the nitride overlying the gate oxide is removed by an etching process leaving the underlying gate oxide (1,050 angstroms) on the surface of substrate 11 overlying the source, drain and gate regions to be formed in or on this substrate. The remainder of the process is as described above in conjunction with the first embodiment of this invention.

A feature of this second embodiment is that the source and drain masking dimensions are controlled by the etching of a thin masking oxide (typically about 50 angstroms thick) rather than by masking and etching a silicon dioxide layer of 6,000 angstroms thickness. A thick silicon dioxide layer can cause variations in the sizes of the source, drain and gate regions due to uncontrollable variations in the lateral etch rates of the thick silicon dioxide layer (see layer 14, FIG. 1b). The use of a 50 angstrom thick oxide layer to define the lateral extent of the source, drain and gate regions significantly improves the accuracy with which these regions can be formed due to the decrease in sensitivity of the process to the etch characteristics of silicon dioxide and due to reduction of optical effects such as diffraction and light scattering during the formation of the source and drain openings in the underlying nitride layer 13 and gate oxide layer 12.

In addition, the ion implantation energy required to implant selected impurities in the field of the device is significantly reduced by removal of the initial oxide in the field region. Thus in one embodiment, the phosphorus implant energy was reduced from 120KEV to 40KEV. Alternatively, a chemical deposition can be used to dope the field of the semiconductor device if desired.

Finally, the field oxide thickness can be reduced to about 1.3 microns from the previously required thicker field oxide. This reduces the time required to form the field oxide and thus increases the efficiency of production.

A variation of the above process involves initially forming over all the top surfaces of substrate 11 only a portion of the gate oxide 12 (FIG. 1a). Nitride layer 13 is then formed as before and the backside oxide is removed. Silicon dioxide layer 14 is deposited, gettered and stripped. The nitride layer 13 is then removed over the field of the device typically by etching to expose the underlying gate oxide. The gate oxide initially was formed thinner than in the above two embodiments, for example, 1,000 a thickness of about 500 to angstroms. The removal of the nitride exposes this initial gate oxide in the field of the device. Then, this exposed gate oxide is selectively removed in the field regions. The selected impurity is implanted throughout the field of the device in the same manner as in the second embodiment of this invention and the field of the device is then reoxidized at a temperature of about 1,000°C to a desired thickness. This thickness is typically 1.3 microns. The oxide on the remaining parts of nitrate layer 13 (over the source and drain regions) is now stripped. This oxide has a thickness of about 250 angstroms as a result of the long field oxidation to which the device has previously been subjected. In removing this oxide, the etch process is continued to overetch this oxide by about the equivalent of 750 angstroms. This insures that all the oxide above nitride layer 13 is completely removed but has little effect on the field oxide. Next the nitride layer 13 overlying the source, drain and gate regions to be formed in the device is removed. The gate is then reoxidized to form an additional 250 to 750 angstroms of oxide over the source, drain and gate regions as desired. If desired, this reoxidation and the initial oxidation are both carried out in a gettering environment. Typically a halogen gettering is used during the oxidation. This is necessary because the nitride deposition can contaminate the oxide.

Note that in the last decribed embodiment of this invention, the gate oxide again remains over the device after it is initially formed. However, any oxide or nitride layers over the field of the device are removed to allow the placing of an impurity in the field of the device to prevent channeling. Then the field oxide is reformed to the desired thickness over the device. However, that part of the gate oxide covering the source, drain and gate regions is left on the device throughout all of this processing thereby preventing contaminants from forming in the gate or source and drain regions.

The gettering of the oxide after the deposition of nitride layer 13 protects the device from any sodium and other metallic contamination which might have occurred prior to this gettering. Again, the removal of the nitride and the underlying oxidation provides a visual check to insure complete nitride removal. Incomplete nitride removal on the device can cause buried contact problems and certain surface problems.

The additional oxidation of the gate dielectric after the field oxidation and nitride removal eliminates certain high $Q_{ss}$ edge effects characteristic of particularly small MOS transistors.

The increase in the gate oxide thickness to about 1,200 angstroms increases the threshhold voltage a slight amount (typically from about 1.3 volts to about 1.5 volts).

The growth of gate oxide layer 12 on substrate 11 before subsequent processing followed by selective oxidation of the field regions offers significant processing advantages. It permits optimized surface preparation of the starting wafer independent of other processing steps required. It virtually eliminates bulk N type impurity "pile-up" subsequent to gate oxidation; almost complete redistribution of any impurity "pile-up" occurring during the initial oxidation step occurs during the subsequent processing. By growth of the field oxide "through" the gate oxide, it avoids any discontinuities due to nonuniform oxidation rates that occur in prior art processing as a result of growing the gate oxide after the thicker field oxide. It also provides smooth transitions from the field to the gate oxide and thus allows thin metal or resistor films to be smoothly covered and accurately formed.

An alternative embodiment of this invention can be used to manufacture depletion-mode MOS transistors. This process uses basically the previously described process steps with, however, the following modification. After the field of the device is oxidized, the silicon dioxide layer 14d and silicon nitride layer 13b, together with intermediate oxide layer 13a are removed from the surface of the device leaving exposed the gate insulation over the source, drain and gate regions. Then window 12b is made through the gate oxide to a selected region in underlying silicon substrate 11. The wafer is then covered with a layer of photoresist and the photoresist above selected source, drain and gate regions is removed by well known photolithographic masking techniques. This is followed by ion implantation of a selected P type impurity such as boron over the top surface of the source, drain and gate regions. This implantation occurs to a thickness of about 1,000 angstroms in a typical embodiment although other thicknesses can also be used if desired and appropriate for the intended purposes. The ion implantation typically takes place at a 50KEV energy level. The result of this ion implantation is to create a thin layer of opposite conductivity type to the predominant conductivity of substrate 11 in and near the top surface of semiconductor material 11. This layer will serve as a channel between to-be-formed source and drain regions with the same conductivity type in the substrate 11. Thus this ion implanted layer makes possible the formation of a depletion-mode MOS transistor rather than the previously described enhancement-mode MOS transistor. Further processing continues as before.

What is claimed is:

1. A metal-oxide-semiconductor structure which comprises:
    semiconductor material containing a source region and a drain region formed adjacent a surface of said material;
    insulation overlying said surface of said semiconductor material, said insulation comprising a first portion of a first substantially uniform thickness overlying that portion of the surface of said semiconductor material between said source region and said drain region and parts of said source region and said drain region, a second portion of a second substantially uniform thickness overlying the field of said semiconductor material surrounding said source region, said drain region and the region between said source region and said drain region, and a third portion connecting said first portion to said second portion and overlying the peripheries of said source region and said drain region and the region of said field directly adjacent to said source region and said drain region, said third portion of insulation comprising a first section of insulation extending from said first portion toward said second portion and a second section of insulation material extending from said first section of insulation into contact with said second portion, said first section having a thickness which increases gradually from the thickness of said first portion to a peak; the top surface of said first section rising gradually to said peak, said first section ending at said peak, said second section beginning at said peak and having a thickness equal to that of said first section beneath said peak and which remains approximately constant for a selected distance and then gradually increases until at the point where said second section joins said second portion, said second section has a thickness equal to that of said second portion, said second section having a top surface which in the region adjacent said peak has a slope opposite in sign to that of the top surface of said first section, said top surface of said second section forming a trough in the region between said peak and said second portion; a gate electrode formed over said insulation between said source region and said drain region;
    insulating material covering the top surfaces of said source region and said drain region, said gate electrode and said insulation; and
    contact leads contacting said source region, said drain region, and said gate electrode through openings in said insulating material.

2. Structure as in claim 1 wherein said insulation comprises an oxide of said semiconductor material.

3. Structure as in claim 1 wherein said semiconductor material comprises silicon and said insulation comprises an oxide of silicon.

4. Structure as in claim 1 wherein said gate electrode comprises selectively doped polycrystalline silicon.

5. Structure as in claim 1 wherein said first portion of insulation comprises the insulation between said gate electrode and said semiconductor material.

6. Structure as in claim 5 wherein said gate insulation has a thickness between approximately 500 to approximately 1,000 angstroms.

* * * * *